United States Patent
Kuhlmann et al.

[11] Patent Number: 5,929,499
[45] Date of Patent: Jul. 27, 1999

[54] PHOTODIODE ARRAY

[75] Inventors: Werner Kuhlmann, Munich; Martin Schmidt, Emskirchen; Rolf Lindner; Roland Ziegler, both of Erlangen, all of Germany

[73] Assignee: Siemens Aktiengesellschaft, Munich, Germany

[21] Appl. No.: 08/951,456

[22] Filed: Oct. 16, 1997

Related U.S. Application Data

[63] Continuation of application No. 08/542,913, Oct. 13, 1995, abandoned.

[30] Foreign Application Priority Data

Nov. 9, 1994 [DE] Germany ............................. 44 39 995

[51] Int. Cl.⁶ ..................... H01L 31/115; H01L 31/103; H01L 27/146; G01T 1/24
[52] U.S. Cl. ........................ 257/429; 257/446; 257/544; 250/370.09; 250/370.14
[58] Field of Search .................................. 257/429, 446, 257/544; 250/370.09, 370.14

[56] References Cited

U.S. PATENT DOCUMENTS

| | | | |
|---|---|---|---|
| 4,903,103 | 2/1990 | Yamashita et al. | 257/446 |
| 4,914,301 | 4/1990 | Akai | 257/429 |

FOREIGN PATENT DOCUMENTS 62-232959  10/1987  Japan ..................................... 257/446

*Primary Examiner*—Jerome Jackson, Jr.
*Attorney, Agent, or Firm*—Hill & Simpson

[57] ABSTRACT

In a photodiode array suitable for use in an x-ray detector for computed tomography, the influences of direct conversion of x-rays into contributions to the electrical output signal and optical cross-talk between channels in the photodiode array are significantly reduced by integrating a number of extraction diodes into the photodiode array, with one extraction diode disposed between each two neighboring photodiodes. The anodes of all of the extraction diodes are connected together at a common anode contact, the common anode contact being connected to a voltage source which applies a voltage across all of the extraction diodes for operating the extraction diodes reverse biased, i.e. so as to block current flow.

1 Claim, 1 Drawing Sheet

PHOTODIODE ARRAY

This is a continuation of application Ser. No. 08/542/913, filed Oct. 13, 1995, now abandoned.

BACKGROUND OF THE INVENTION

1. Field of the Invention

The present invention is directed to a photodiode array of the type suitable for use in an x-ray detector which converts the energy of incident x-rays into a corresponding electrical signal.

2. Description of the Prior Art

X-ray detectors are employed in medical examinations, such as in x-ray computed tomography, the x-ray detector serving to convert incident x-rays into corresponding electrical signals. The most widely employed x-ray detectors in this context are in the form of an array of xenon ionization chambers, or scintillators followed by photodiodes.

In a scintillator/photodiode array, the scintillator converts incident x-ray quanta into photons. The photodiode, disposed following the scintillator in the radiation propagation direction, absorbs the photons and a photocurrent is thus obtained that is proportional to the luminous intensity of the incident x-ray.

Problems associated with the use of such photodiode arrays in an x-ray detector are that a small portion of the incoming x-ray quanta may penetrate to a slight extent directly into a photodiode in the array, thereby producing an unwanted noise signal, and cross-talk between detector channels must be avoided.

SUMMARY OF THE INVENTION

It is an object of the present invention to provide a photodiode array wherein the photodiodes of the array are monolithically constructed on a substrate, wherein x-ray quanta which may penetrate to a slight extent directly into the photodiodes of the array do not generate an unwanted noise signal, and wherein signal cross-talk between detector channels is substantially reduced.

The above objects are achieved in accordance with the principles of the present invention in a photodiode array suitable for use in x-ray computed tomography wherein a plurality of photodiodes, such as in a row, is disposed on a substrate with an extraction diode connected between each two neighboring photodiodes. The anodes of all of the extraction diodes are connected together at a common anode contact, and a voltage is applied across the extraction diodes by connecting a voltage source to the common anode contact so that the extraction diodes are reversed biased and thus block current flow.

DESCRIPTION OF THE PREFERRED EMBODIMENTS

Figure 1:
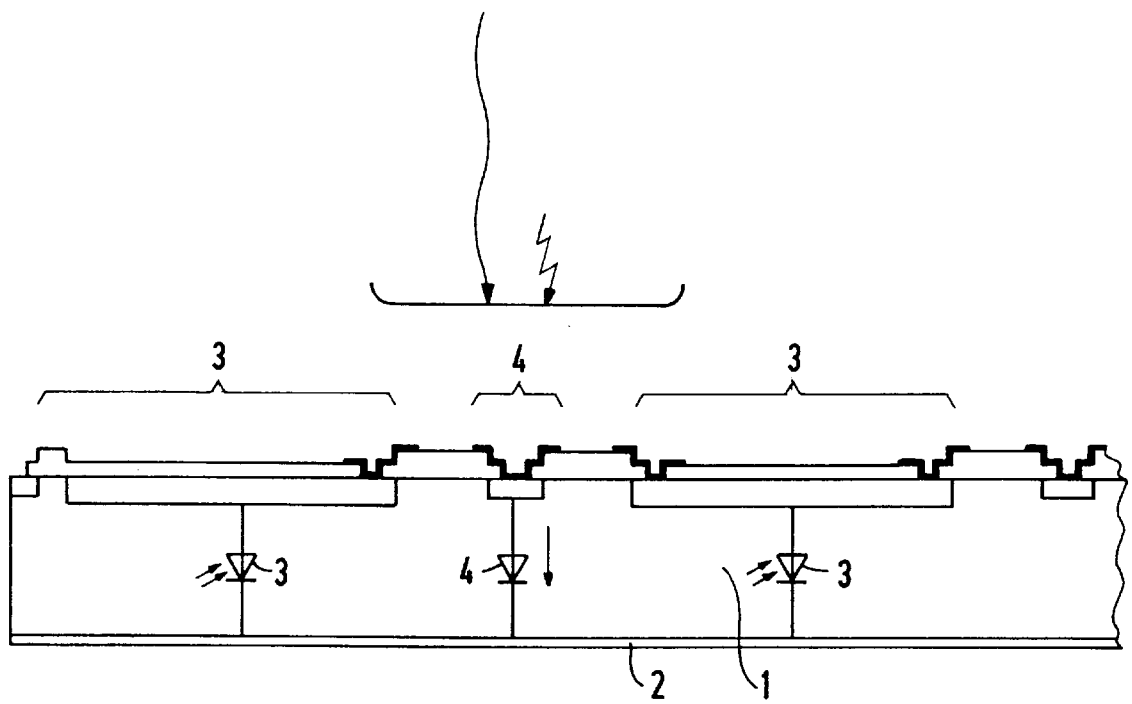
FIG. 1 is a schematic sectional view of a photodiode array constructed in accordance with the principles of the present invention.

A photodiode array is shown in FIG. 1, having a row or series of photodiodes 3, which are manufacturing on a substrate 1, having a back side contact 2. An extraction diode 4, which is also manufactured on the substrate 1, is disposed between each two neighboring photodiodes 3. A scintillator (now shown) precedes the photodiode array in the direction of propagation of incoming x-rays, and the photodiodes 3 convert light generated by the interaction of the x-rays with the scintillator into a corresponding electrical signal. The photodiodes 3 and the extraction diodes 4 are also illustrated with electrical circuit symbols in FIG. 1.

The extraction diodes 4 produce a noticeable reduction in the contribution made to the output electrical signals of the photodiodes 3 by direct conversion of x-ray quanta incident on the photodiodes and due to optical cross-talk between channels of the photodiode array.

A further noticeable signal improvement can be achieved if the space charge zone of the extraction diode 4 is made to extend from the anode region (p-region) into the proximity of the cathode region (n-region) for that purpose, the diode pairs (the photodiode 3 and the extraction diode 4 surrounding it) are connected in the following manner.

Figure 2:
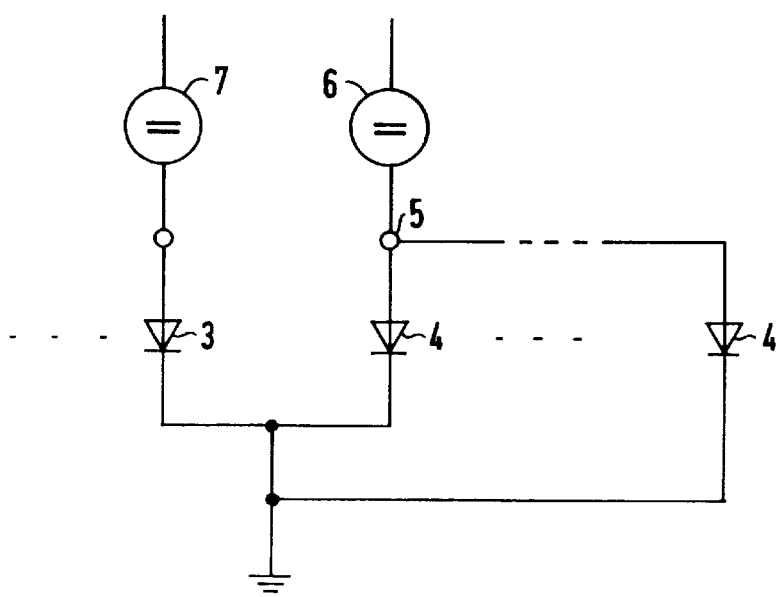
FIG. 2 is a circuit diagram for operating the photodiode array shown in FIG. 1.

During manufacture, all extraction diodes 4 are connected together at the anode side and to a common anode contact 5. The common anode contact 5 is connected to a voltage source 6 (voltage $U_{ab}$=0–100V) so that the extraction diodes 4 are operated reverse biased, i.e. so as to block current flow, as shown in FIG. 2. By suitable selection of the extraction voltage $U_{ab}$ and the bias voltage across the photodiode 3, supplied by the voltage source 7, the space charge zone in the extraction diode 4 can be set to achieve the following results. The direct conversion, at the edge region of the 2 diodes 3 and 4, of x-rays into contributions to the electrical output signal is minimal. The optical cross-talk in the silicon chip on which the diodes 3 and 4 are manufactured is suppressed. The individual photodiodes are electrically separated. The dark current in the photodiode 3 becomes minimal. As a result of the extremely low dark current, the dark current temperature coefficient of the photodiode 3 is extremely low. All of these achievements result in a significant improvement in the properties of a computed tomography x-ray detector in which the photodiode is used, and thus can result in improved computed tomographic images.

Although modifications and changes may be suggested by those skilled in the art, it is the intention of the inventors to embody within the patent warranted hereon all changes and modifications as reasonably and properly come within the scope of their contribution to the art.

We claim as our invention:

1. A photodiode array comprising:

a substrate having a surface on which incoming light is incident;

a plurality of photodiodes integrated in said substrate, each of said photodiodes having a light sensitive region completely disposed only at said surface;

a plurality of extraction diodes integrated on said substrate with one extraction diode disposed at said surface alternating with the respective light sensitive surfaces of said photodiode, each extraction diode having an anode;

a common anode contact at which the respective anodes of all of said extraction diodes are connected together;

first voltage source connected across each of said photodiodes, biasing each of said photodiodes; and second voltage source, separate from said first voltage source means and connected to said common anode contact, applying a voltage across each extraction diode for operating each extraction diode only reverse biased and electrically isolating each of said photodiodes.

* * * * *